(12) United States Patent
Korec et al.

(10) Patent No.: US 6,285,060 B1
(45) Date of Patent: Sep. 4, 2001

(54) BARRIER ACCUMULATION-MODE MOSFET

(75) Inventors: Jacek Korec, San Jose; Anup Bhalla, Santa Clara, both of CA (US)

(73) Assignee: Siliconix Incorporated, Santa Clara, CA (US)

(*) Notice: Subject to any disclaimer, the term of this patent is extended or adjusted under 35 U.S.C. 154(b) by 0 days.

(21) Appl. No.: 09/476,320

(22) Filed: Dec. 30, 1999

(51) Int. Cl.[7] .................................................. H01L 29/76
(52) U.S. Cl. .......................... 257/342; 257/331; 257/333; 438/270; 438/273
(58) Field of Search .................................... 257/330, 331, 257/333, 341, 342; 438/270, 273

(56) References Cited

U.S. PATENT DOCUMENTS

| | | | | |
|---|---|---|---|---|
| 4,504,847 | * | 3/1985 | Nishizawa | 257/264 |
| 4,903,189 | * | 2/1990 | Ngo et al. | 363/127 |
| 4,941,026 | * | 7/1990 | Temple | 257/333 |
| 5,072,266 | * | 12/1991 | Bulucea et al. | 257/330 |
| 5,592,005 | * | 1/1997 | Floyd et al. | 257/331 |
| 5,814,858 | * | 9/1998 | Williams | 257/328 |
| 6,087,224 | * | 7/2000 | Luo | 438/270 |
| 6,114,727 | * | 9/2000 | Ogura et al. | 257/342 |

FOREIGN PATENT DOCUMENTS

| | | | | |
|---|---|---|---|---|
| 4-05-226661 | * | 9/1993 | (JP) | 257/331 |
| 4-05-335582 | * | 12/1993 | (JP) | 257/331 |

OTHER PUBLICATIONS

Shekar et al., A New Trench Gate Accumulation Mode Field Effect Emitter Switched Thyristor, Proceedings of 1995 International Symposium on Power Semiconductor Devices & ICs, pp. 185–189.*

Tsengyou Syau et al., "Comparison of Ultralow Specific On–Resistance UMOSFET Structures: The ACCUFET, EXTFET, INVFET, and Conventional UMOSFET's", IEEE Transactions on Electron Devices, vol. 41, No. 5 (May 1994), 9 pages.

Steve Merchant, "Analytical Model for the Electric Field Distribution in SOI RESURF and TMS Structures", IEEE Transactions on Electron Devices, vol. 46, No. 6, Jun. 1999, pp. 1264–1267.

S.M. Sze, "Physics of Semiconductor Devices Second Edition", A Wiley–Interscience Publication, p. 140.

* cited by examiner

*Primary Examiner*—Eddie Lee
*Assistant Examiner*—George C. Eckert, II
(74) *Attorney, Agent, or Firm*—Skjerven Morrill MacPherson LLP; David E. Steuber

(57) ABSTRACT

In a trench-gated MOSFET, a lightly doped drift region of the N-type drain lies in the mesa between the trenches. The gate is doped with N-type material so that depletion regions are formed in the drift region when the gate voltage is equal to zero. The depletion regions merge at the center of the mesa, pinching off the flow of current when the device is turned off. This current-pinching effect allows the P-type body region to be made shallower and doped more lightly than usual without creating a punchthrough problem, because the barrier represented by the depletion regions adds to the normal current blocking capability of the PN junction between the body and drain regions. When the device is turned on by biasing the gate to a positive voltage, a low resistance accumulation layer forms in the drift region adjacent the trenches.

19 Claims, 13 Drawing Sheets

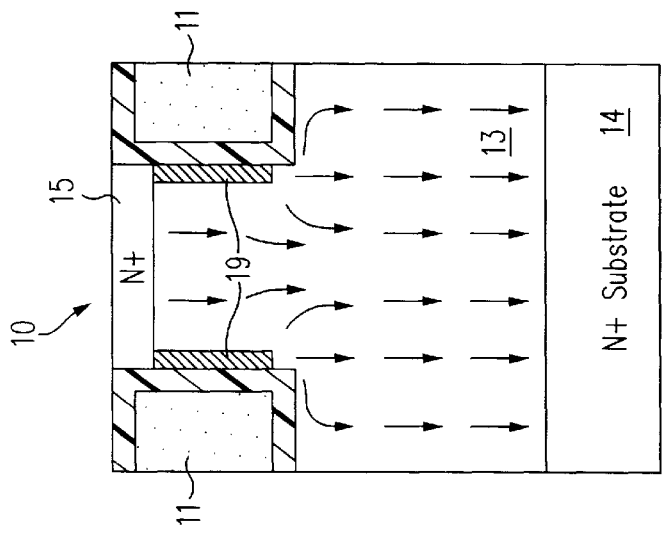
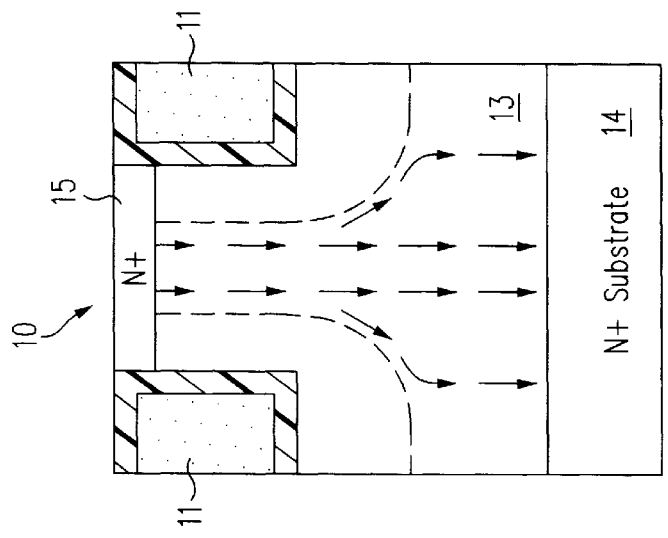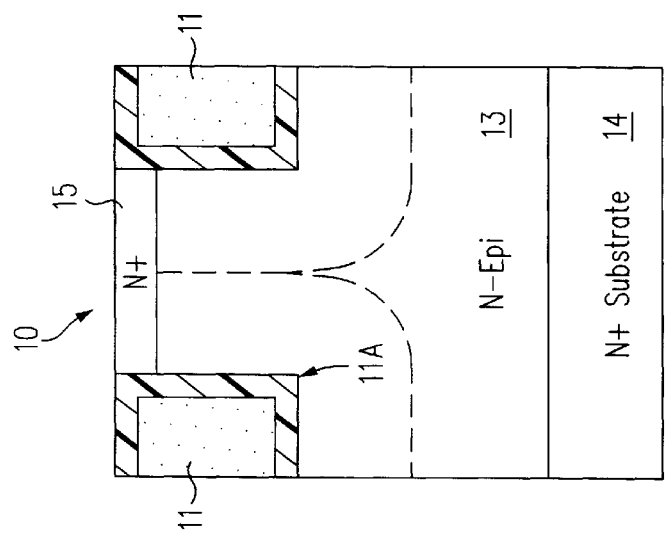

BARRIER ACCUMULATION-MODE MOSFET

FIELD OF THE INVENTION

The present invention relates to power semiconductor devices, and more particularly to trench-gated power semiconductor devices having a low threshold voltage.

BACKGROUND OF THE INVENTION

Power MOSFETs are used in a wide range of applications, including automotive electronics, disk drives, and power supplies. Some low-voltage applications (e.g., less than 30 V) require power MOSFETs to have a low threshold voltage, since the logic level in these applications is low. This is the case in battery switching applications, for example, where the logic level will drop to 1.8 V in the near future.

There are two major factors that affect the threshold voltage in conventional MOSFETs. The first factor is the thickness of the gate oxide. In a MOSFET the threshold voltage is directly proportional to the thickness of the gate oxide. Thus a thinner gate oxide leads to a lower threshold voltage. The second factor is the concentration of the dopant that is implanted or diffused in the body region of the device. In trench-type power MOSFETs, the body region is located in the "mesa" between the trenches. In such a device, the threshold voltage is proportional to the square root of the concentration of dopant in the body region. Thus a lower concentration of dopant in the body region leads to a lower threshold voltage.

There are limits, however, to how thin a gate oxide can be, and how low the concentration of dopant in the body region can be. A gate oxide that is very thin can lead to stability problems at the corners of the trench or reduced reliability of the device. Additionally, a thin gate oxide places a limit on the maximum gate-to-source voltage, $V_{GS,Max}$ that the device can withstand and increases the gate capacitance, which limits the switching speed of the device. For example, in a device having a gate oxide thickness $T_{ox}$ of 170 Å, the maximum gate voltage is ±8 V. Finally, from a manufacturing standpoint, it is very difficult to fabricate a device with a very thin gate oxide layer, especially a gate oxide layer that is less than 100 Å thick.

Similarly, there are limits to how low the concentration of dopant can be in the body region. A very low concentration of dopant in the body region may lead to punchthrough. Punchthrough occurs when the drain voltage is increased to a level where the body region is totally depleted of charge, and therefore the source becomes coupled to the drain. A higher dopant concentration in the body ensures that there will be enough charge in the body region to prevent punchthrough. It is known in the art that, to prevent punchthrough, the charge in the body region of a trench MOSFET must be at least $2\times10^{12}$ cm$^{-2}$, calculated as an integral of the net doping concentration in the body region between the source and drain junctions. A similar restriction applies to the doping of the base region in a bipolar transistor. For silicon bipolar transistors the Gummel number is about $10^{12}$ to $10^{13}$ cm$^{-2}$ (see Sze, *Physics of Semiconductor Devices*, Second Edition, Chapter 3.2.1, page 140).

It is also desirable to have MOSFETs that have a short channel length. This is because the channel length is directly proportional to the on-state resistance of the device, $R_{DS}$ (on), which should be minimized. Minimizing the channel length leads to a low on-state resistance. At the same time, however, the channel length cannot be made too small. This is because the channel length is defined by the the width of the body region, and the total charge in the body region must remain high enough to prevent punchthrough. Thus, MOSFETs that have short channels must have higher concentrations of dopant present in the body region to prevent punchthrough. The higher concentration of dopant, in turn, leads to a higher threshold voltage. As a result, it is difficult to fabricate a device with a short channel and a low threshold voltage.

In summary, the design of a conventional MOSFET with a low threshold voltage entails a balancing of the following factors: the length of the channel, the total charge in the body region, and the thickness of the gate oxide. The tradeoffs between these factors make it difficult to fabricate a MOSFET with a low threshold voltage and low on-resistance.

An alternative to using a conventional MOSFET for a low threshold device is to use an "accumulation-mode" field-effect transistor, often referred to as an ACCUFET. ACCUFETs are trench-type devices which contain no body region and hence no PN junctions. The "mesa" between the trenched gates is made relatively narrow (e.g., 0.5 to 1.5 μm wide) and the gate material (typically polysilicon) is doped in such a way that it has a work function which forms a depletion region across the entire mesa, much like a junction field-effect transistor (JFET). The current path extends between a source at the top of the mesa and a drain at the bottom of the substrate. The trenches are normally formed in a lightly-doped epitaxial layer which is grown on top of a heavily-doped substrate.

A cross-sectional view of a typical ACCUFET 10 is illustrated in FIG. 1. Trenched gates 11 are etched in a silicon material 12, which includes an N-epitaxial layer 13 grown on an N+ substrate 14. Trenched gates 11 are doped with N-type material and define two cells 10A and 10B. An N+ source 15 is formed at the top of the mesa between gates 11. A metal layer 16 is formed over the source regions, and a power source 17 and a load 18 are connected between the N+ source 15 and the N+ substrate 14, which acts as the drain.

ACCUFET 10 is turned off when the gate voltage is equal to the source voltage (i.e., $V_{GS}$=0). For an N-type device, decreasing $V_{GS}$ results in a strong pinching of the current path so that the leakage current is reduced. In order to achieve this action, the epitaxial layer must be lightly doped (typically below $3\times10^{16}$ cm$^{-3}$) and the channel must be long in comparison with the width of the mesa (typically less than 1.5 μm). If $V_{GS}$ is increased, the depletion regions surrounding the gates (shown by the dashed lines) contract and open a current path between the source and the drain. With further increasing $V_{GS}$ the depletion regions continue to contract until eventually accumulation regions are formed adjacent the trenches, enhancing channel conduction and further lowering the on-resistance of the device.

This sequence of events is illustrated in FIGS. 2A, 2B and 2C. FIG. 2A shows ACCUFET 10 in the off condition, FIG. 2B shows ACCUFET 10 turned partially on, and FIG. 2C shows ACCUFET 10 turned fully on, with the accumulation regions being designated by the numeral 19. In FIGS. 2B and 2C, the arrows represent the flow of electrons from the source to the drain. In FIG. 2A, the region 11A near the corner of the trench is where breakdown would occur, possibly causing damage to the gate oxide layer as a result of impact ionization and hot carrier injection into the gate oxide.

Additional information concerning ACCUFETs is given in U.S. Pat. No. 4,903,189 issued to Ngo et al.; B. J. Baliga et al., "The Accumulation-Mode Field-Effect Transistor: A New Ultralow On-Resistance MOSFET", IEEE Electron Device Letters, Vol. 13, No. 8, August 1992, pp. 427–429; and T. Syau et al., "Comparison of Ultralow Specific On-Resistance UMOSFET Structures: The ACCUFET, EXTFET, INVFET, and Conventional UMOSFET's", IEEE Electron Device Letters, Vol. 41, No. 5, May 1994, pp. 800–808, each of which is incorporated herein by reference in its entirety.

ACCUFETs can be fabricated with a very high cell density and a very low on-resistance. Despite these advantages, ACCUFETs have not so far achieved widespread use in the field of power semiconductor devices for several reasons. One of the principal reasons is that the leakage current in these devices is typically too high. Conversely, the long channel length and light epitaxial doping concentration required to reduce the leakage current produce a device that has a high on-resistance.

Accordingly, there is a need for a switching device with a low threshold voltage, a thick gate oxide, and low on-resistance.

SUMMARY OF THE INVENTION

A barrier accumulation-mode field-effect transistor (Barrier-ACCUFET) according to this invention fulfills this need. The Barrier-ACCUFET is fabricated in a semiconductor chip having first and second principal surfaces. A trench extends from the first surface of the semiconductor chip into the structure, the trench having first and second sections which define a mesa. A gate is disposed in the trench and insulated by a dielectric layer, typically an oxide, from the semiconductor chip, the gate being doped with ions of a first conductivity type. A source region of the first conductivity type is located in the mesa adjacent the first surface of the semiconductor chip. A body region of a second conductivity type is located in the mesa beneath the source region and adjacent the trench. A drain region of the first conductivity type is located beneath the body region. A drift region of the drain lies in the mesa between the gate trenches and may extend below the gate trenches. The drift region is typically doped more lightly than other portions of the drain.

In contrast with conventional MOSFETs, the net charge density in the body region is no greater than $1.5 \times 10^{12}$ cm$^{-2}$, measured with reference to a plane parallel to the top surface of the semiconductor and calculated as an integral of the net doping concentration in the body region between the source and drain junctions (i.e., each centimeter by centimeter "column" of the body region extending from the source to the drain contains no more than $1.5 \times 10^{12}$ ions). This in turn allows the dielectric (oxide) layer to be thicker and the threshold voltage to be lower than is possible in conventional MOSFETs. In addition, the body region can be shallow and the channel can be short, thereby reducing the on-resistance of the Barrier-ACCUFET.

The light doping of the body region is possible for the following reasons. As in a conventional MOSFET, the body-drain junction is normally reverse-biased when the device is turned off and represents a barrier to the flow of current between the source and drain. In the Barrier-ACCUFET, however, the doping concentration of ions of the first conductivity type in the gate, the thickness of the gate oxide layer, the dimensions of the mesa, and other parameters are such that the drift region in the mesa is fully depleted when the device is turned off, impeding the flow of current between the source and drain regions. To accomplish this, the net charge density of ions of the first conductivity type in the portion of the drift region between the trenches is no greater than $5 \times 10^{12}$ cm$^{-2}$, measured with reference to a plane perpendicular to the top surface of the semiconductor and calculated as an integral of the net doping concentration across the mesa from trench to trench (i.e., each centimeter by centimeter "column" of the drift region in the mesa, extending from the trench to trench, contains no more than $1.5 \times 10^{12}$ ions). This depletion region represents a second barrier to the flow of current between the source and drain. The body region therefore does not need to be doped as heavily as in prior art MOSFETs to prevent punchthrough behavior when the device is turned off.

When the device is turned on by biasing the gate in the direction of the second conductivity type, the depletion regions in the mesa shrink and an accumulation region is formed adjacent the trenches. This, combined with the short channel, reduces the on-resistance of the Barrier-ACCUFET.

In many embodiments, the semiconductor chip includes an epitaxial layer that is grown on a substrate. The substrate is typically doped more heavily than the epitaxial layer, and thus dopant diffuses some distance upward from the substrate into the epitaxial layer, creating a doping gradient at a level above the original interface between the substrate and the epitaxial layer. In many embodiments, the trench extends into this gradient, although in other embodiments the trench bottom is located above the gradient.

Other features and advantages of the invention are described below.

BRIEF DESCRIPTION OF THE DRAWINGS

FIGS. 2A–2C illustrate the operation of the ACCUFET.

FIG. 6B shows a cross-sectional view of a Barrier-ACCUFET according to this invention in an intermediate condition between off and on.

DESCRIPTION OF THE INVENTION

Figure 3:
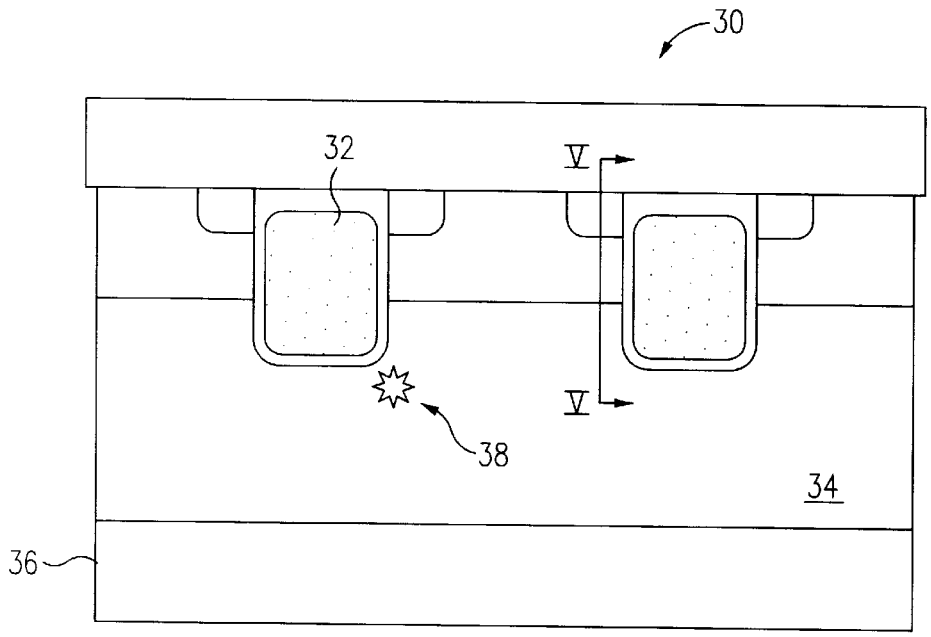
FIG. 3 is a cross-sectional view of a conventional trench MOSFET.
Figure 4:
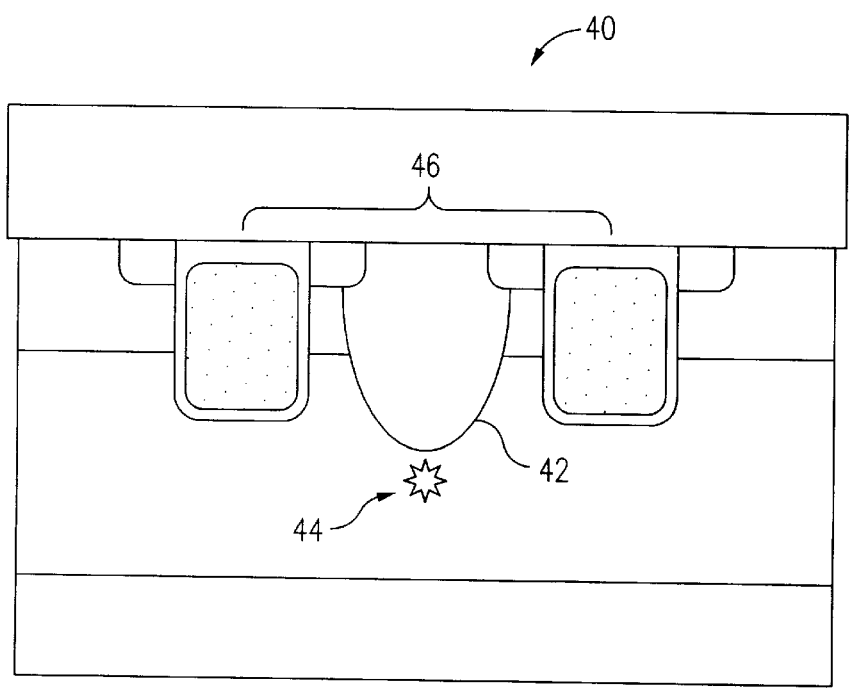
FIG. 4 is a cross-sectional view of a trench MOSFET with a deep diffusion which acts as a voltage clamp.

A cross-sectional view of a conventional trench MOSFET 30 is shown in FIG. 3. A gate 32 is formed in an epitaxial layer 34 over a substrate 36. Avalanche breakdown occurs at a corner of the trench designated 38. FIG. 4 shows a MOSFET 40 with a deep diffusion 42 of the kind taught in U.S. Pat. No. 5,072,266 to Bulucea et al., which forms a "clamping diode". Provided that the device is properly designed, breakdown occurs at the lowermost point 44 of the deep diffusion 42, away from the trench where the generation of hot carriers might damage the gate oxide layer. The MOSFET cell 46 shown in FIG. 4 is only one of numerous MOSFET cells that are formed in an array and together make up the entire power device. U.S. Pat. No. 5,072,266 shows a deep diffusion in every MOSFET cell. Alternatively, the deep diffusions can be formed in separate "diode cells" that do not contain a channel and that are repeated in a pattern across the array of MOSFET cells, as taught in U.S. Pat. No. 5,814,858 to Williams et al. Whether the clamping diode is formed in the MOSFET cells or in separate diode cells, the tip of the deep diffusion is preferably located at a level that is below the bottom of the trench. Even with the clamping diode, there is a critical thickness of the gate oxide layer below which the point of avalanche breakdown shifts back to the corner of the trench (see col. 10, lines 46–68 of U.S. Pat. No. 5,072,266).

Figure 5:
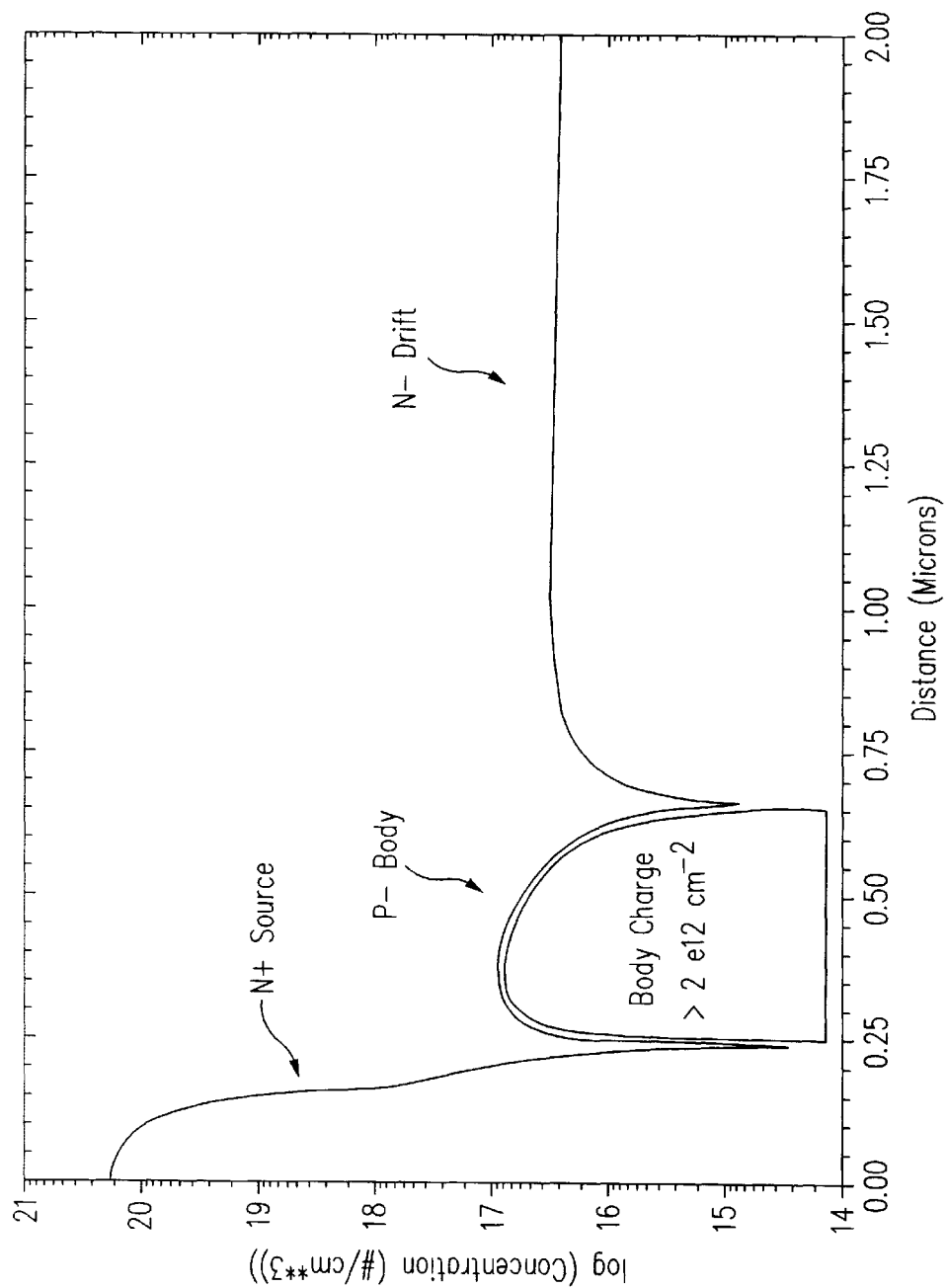
FIG. 5 is a graph of the dopant profile of the source and body regions in a prior art MOSFET.

FIG. 5 shows a graph of the dopant profile of the source and body regions in a prior art MOSFET, taken at a vertical cross-section in the vicinity of the channel region (see cross-section V—V in FIG. 3). The vertical axis is the $\log_{10}$ of the dopant concentration in atoms/cm$^3$; the horizontal axis is the distance in $\mu$m below the surface of the semiconductor material. The width of the body region determines the length of the channel region which must be minimized for a low on-resistance $R_{ds}(on)$. The peak dopant concentration of the body region ($10^{17}$ cm$^{-3}$) and the thickness of the gate oxide layer determine the threshold voltage Vth. The net charge density of the body region (expressed as charge per unit area in a plane parallel to the surface of the semiconductor material) must be large enough to prevent punchthough. The prior art recognized that the net charge density in the body region must be at least 2×10$^{12}$ atoms/cm$^2$ (frequently abbreviated as cm$^{-2}$) to ensure that punchthough does not occur. (As used herein, the net charge density of the body region expressed as atoms/cm$^2$ or cm$^{-2}$ refers to the number of charges in a vertical column measuring one centimeter by one centimeter extending through the entire depth of the body region. This is distinguished from the doping concentration, measured in atoms/cm$^3$ or simply cm$^{-3}$, which is the number of charges in a cubic centimeter of the semiconductor material.)

Figure 6A:
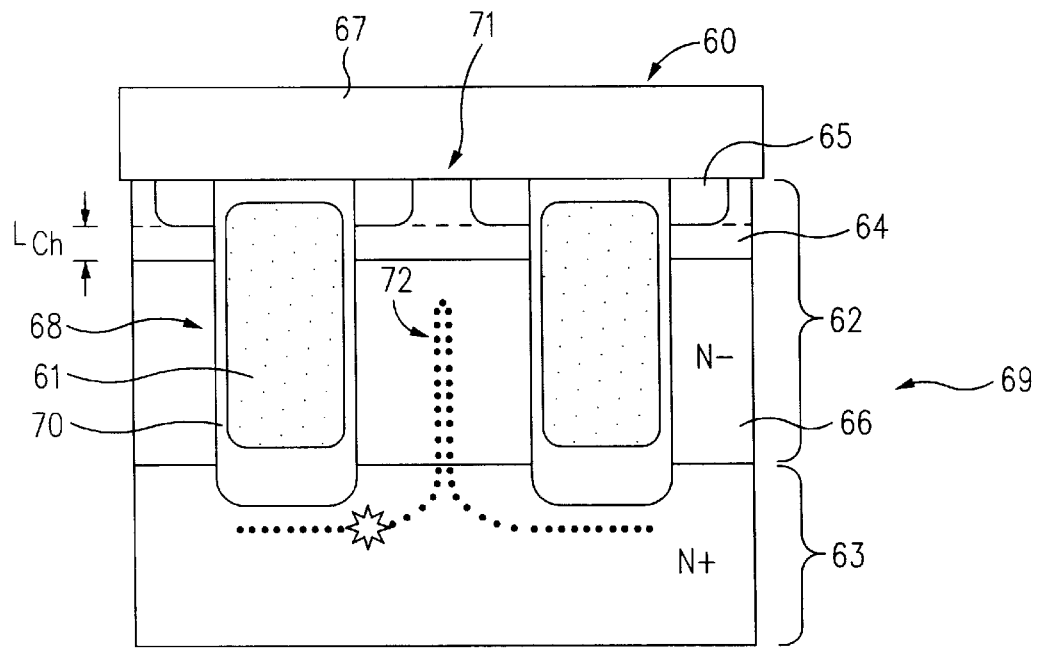
FIG. 6A shows a cross-sectional view of a Barrier-ACCUFET according to this invention in an off condition.
Figure 6B:
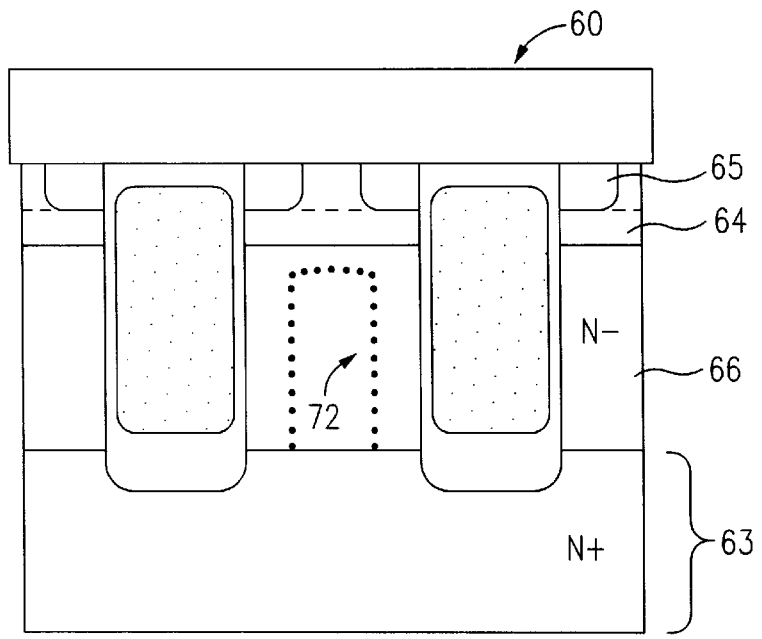
Figure 6C:
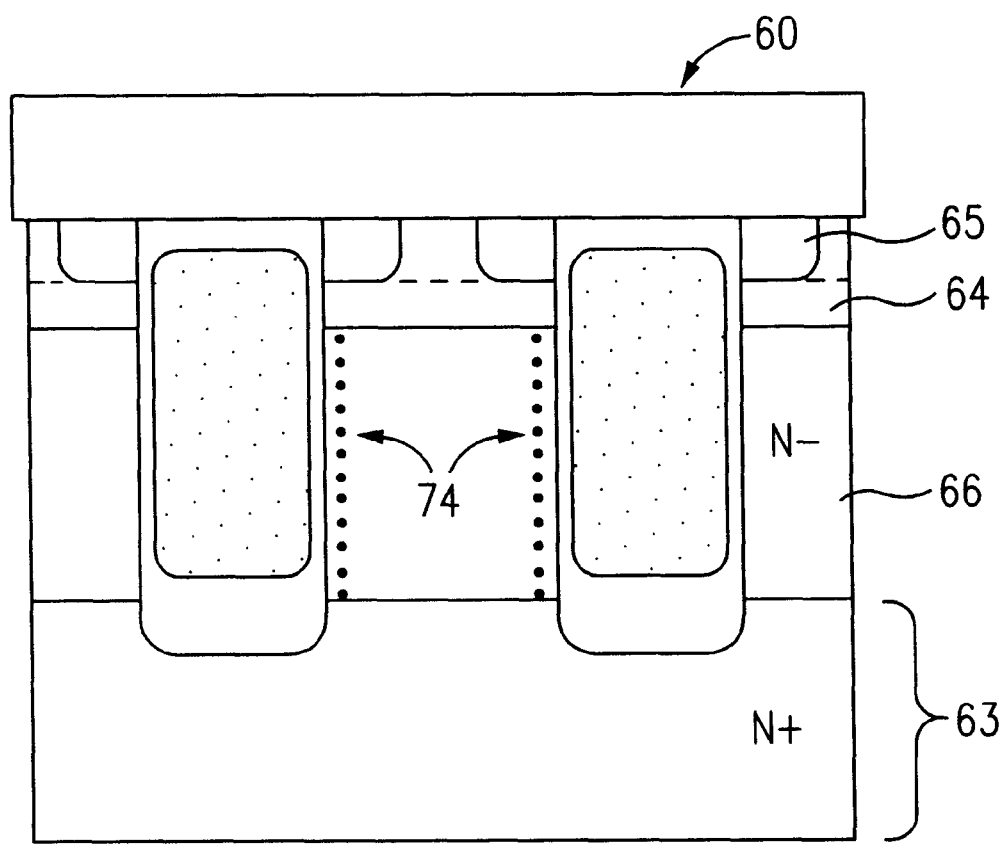
FIG. 6C shows a cross-sectional view of a Barrier-ACCUFET according to this invention in an on condition.

A MOSFET according to this invention, referred to as a Barrier-ACCUFET, is illustrated in FIGS. 6A, 6B and 6C. MOSFET 60 is formed in a semiconductor chip 69 which includes includes an epitaxial layer 62 and an N+ substrate 63. Epitaxial layer 62 includes a P-body region 64, an N+ source region 65 and a lightly doped N− drift region 66, which extends from the junction with P-body region 64 to the location where the doping concentration increases as a result of updiffusion from N+ substrate 63. This location is somewhat above the interface between epitaxial layer 62 and N+ substrate 63. N− drift region 66 and N+ substrate 63 are included within the drain of MOSFET 60. A metal layer 67 makes electrical contact with P-body region 64 and N+ source region 65. In other embodiments the N+ source region extends across the entire top surface of the mesa and the P-body region is contacted in the third dimension (see, e.g., FIG. 12).

Figure 1:
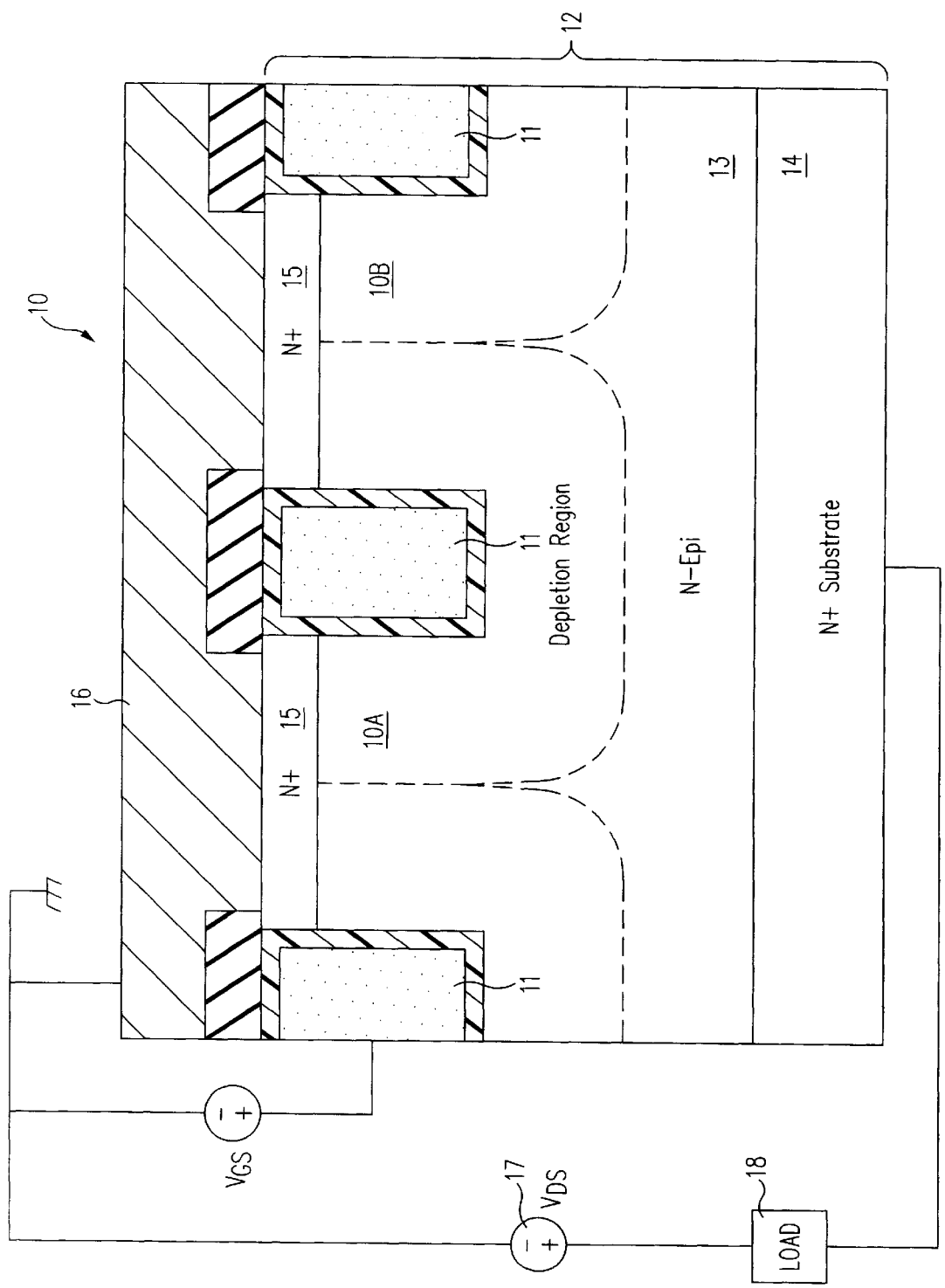
FIG. 1 is a cross-sectional view of a conventional accumulation-mode MOSFET (ACCUFET).

MOSFET 60 is typically connected in a circuit with a power source and a load in a way similar to MOSFET 10 as shown in FIG. 1, so that a voltage difference is applied between the metal layer 67 and the N+ substrate 63 (drain) of MOSFET 60.

A gate 61 is formed in a trench 68 that extends through epitaxial layer 62 and into N+ substrate 63. Gate 61 is separated from the semiconductor material by an oxide layer 70. P-body region 64 is shallow, defining a short channel having a length $L_{ch}$ between N+ source region 65 and N− drift region 66 adjacent the sidewall of the trench 68.

Two sections of trench 68 are shown and they define a mesa 72 of the semiconductor chip 69. There are many additional trench sections and mesas in the entire device, which is only partially shown in FIGS. 6A–6C.

The gate 61 is doped with an N-type material such as phosphorus. The electric field produced by the doped gate creates depletion regions, denoted by the dotted line 72 in FIG. 6A, in N− drift region 66. When Barrier-ACCUFET 60 is turned off, the depletion regions merge at the center of the mesa and effectively "pinch" the electric field in the mesa between the trenches, impeding the flow of current between the N+ source region 65 and the N+ substrate 63. The pinching of the electric field by the trench gate is used to shield the body region against the punchthrough effect. In this device, the body region can be made very shallow (e.g., a channel length less than 0.4 $\mu$m) while keeping the maximum body doping concentration below 1×10$^{17}$ cm$^{-3}$. The two-dimensional pinching effect caused by the electric field generated by the gate electrodes and the body-drain junction allows the net charge density in the body region to be lower than 1.5×10$^{12}$ cm$^{-2}$. The low doping concentration and net charge density in the body region allow the use of a relatively thick gate oxide layer (e.g., more than 250 Å thick) while maintaining the threshold voltage at a low level (e.g., less than 1.2 V). This increases the maximum allowable gate-to-source voltage $V_{GS}$ (MAX) and lowers the gate capacitance, thereby increasing the switching speed of the device.

As shown in FIG. 6B, when the gate voltage of the Barrier-ACCUFET is increased, the depletion regions surrounding the trench contract and, as shown in FIG. 6C, when the gate voltage is further increased, accumulation regions (denoted by the dotted lines 74) are formed in the drift region 66 adjacent the trench 68. Also, as in a normal MOSFET the channel region of the P-body is inverted along the interface with the gate oxide. Thus a very low resistance current path between the source and the drain is formed through the short channel and the accumulation regions 74.

In the preferred embodiment, the trenches extend through the epitaxial layer and at least into the doping gradient created by the updiffusion of dopant from the more heavily doped substrate, and the gate oxide layer is made thicker (e.g., more than 0.1 μm thick) at the bottom of the trench. This is particularly useful for devices having a maximum drain voltage of 10 V or more.

The epitaxial layer can be doped uniformly, or the epitaxial layer can be graded, with a ratio between the doping concentration at the interface with the substrate to the doping concentration at the junction with the body region in the range of 3:1 to 7:1.

A specific embodiment of this invention, in the form of a 20 V N-channel Barrier-ACCUFET will now be described, it being understood that the principles of this invention extend to numerous other embodiments. It is assumed that the Barrier-ACCUFET is used to switch a current generated by a battery and requires a low threshold voltage $V_{th}$ of less than 1 V and a maximum source-to-gate voltage $V_{GS}$ (MAX) of 12 V. These requirements cannot be fulfilled by a conventional design of a trench-gated MOSFET without an excessively long, channel. For example, the $V_{GS}$ (MAX) specification of 12 V would normally require a gate oxide at least 300 Å thick, and the body doping concentration would have to be high enough to prevent punchthrough, resulting in a $V_{th}$ larger than 1 V.

Figure 7B:
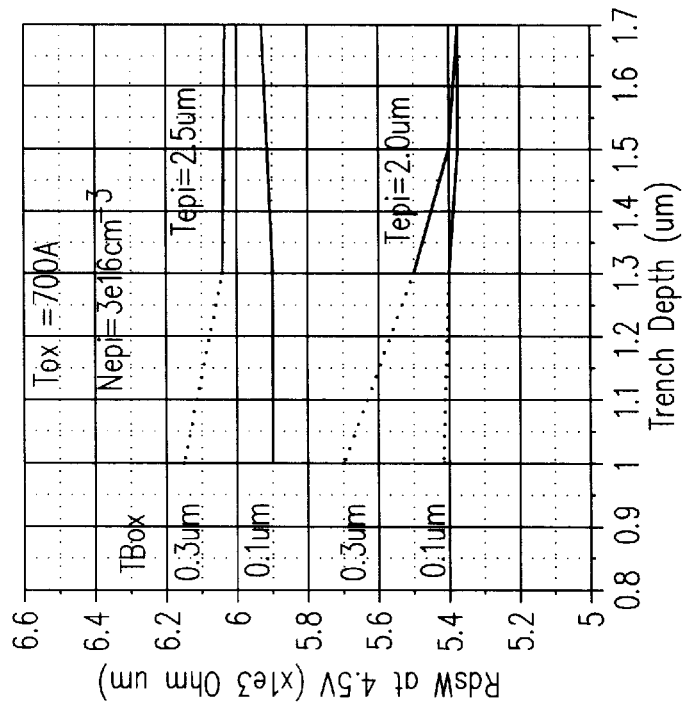
FIG. 7B is a graph of the specific on-resistance of the Barrier-ACCUFET as a function of the depth of the trench.
Figure 7A:
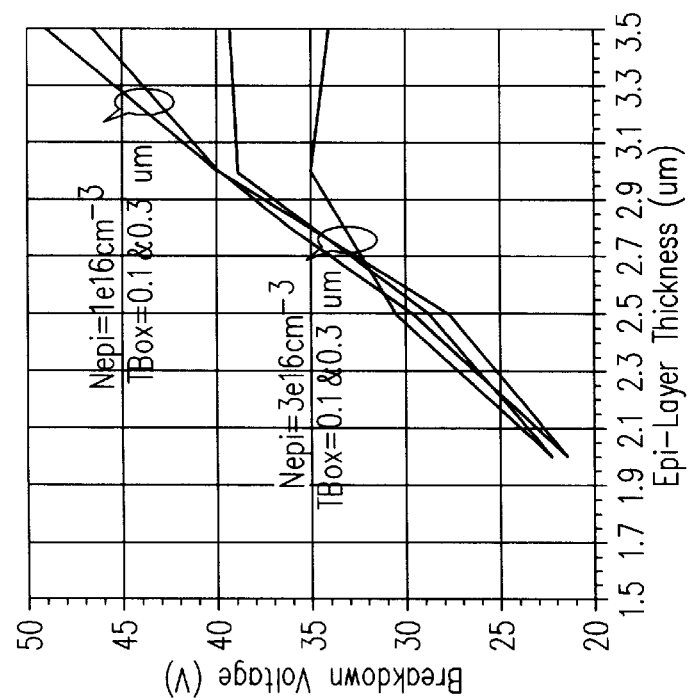
FIG. 7A is a graph of the breakdown voltage of the Barrier-ACCUFET as a function of the thickness of the epitaxial layer.

FIGS. 7A and 7B are graphs produced by computer simulations, using the MEDICI program, for a Barrier ACCUFET having a trench width of 0.8 μm and a mesa width of 1.2 μm, for a pitch of 2.0 μm. FIG. 7A shows the breakdown voltage of the device as a function of the thickness of the epitaxial layer ("epi-layer") for the following cases: (i) the doping concentration of the epi-layer ($N_{epi}$) equal to $1 \times 10^{16}$ cm$^{-3}$ or $3 \times 10^{16}$ cm$^{-3}$ and (ii) the thickness of the gate oxide layer at the bottom of the trench (TB$_{ox}$) equal to 0.1 μm or 0.3 μm. FIG. 7B shows the specific resistance of the device per unit of channel width ($R_{ds}W$) at a gate voltage of 4.5 V, where $N_{epi}=3\times10^{16}$ cm$^{-3}$ and the thickness of the gate oxide at the sidewalls of the trench $T_{ox}=700$ Å. The results are shown for TB$_{ox}$ equal to 0.1 μm or 0.3 μm and the thickness of the epi-layer $T_{epi}$ equal to 2.0 μm or 2.5 μm. Because of updiffusion, the doping gradient between the heavily doped substrate and the lightly doped drift region lies somewhat above the interface between the substrate and the epi-layer. The proper design of a Barrier-ACCUFET requires the trench to be deep enough to pinch the current in the mesa region effectively. The transition point between the dotted and solid lines in FIG. 7B indicates the minimum trench depth to prevent punchthrough behavior of the Barrier-ACCUFET.

In order to minimize the on-resistance of the Barrier ACCUFET, the epi-layer should be made as thin as possible. A thicker epi-layer results in an excessive contribution of the epi-layer resistance to the total on-resistance of the device. As FIG. 7A indicates, the epi-layer can be less than 3 μm thick while still providing a breakdown voltage that is suitable for a 20 V device. On the other hand, FIG. 7B shows that the depth of the trench should be greater than 1.3 μm to prevent punchthrough behavior. Preferably, the trench extends into the doping gradient in the epi-layer produced by the more heavily doped substrate. This allows full use of the additional current path through the accumulation layer adjacent the side walls of the trenches.

Figure 8:
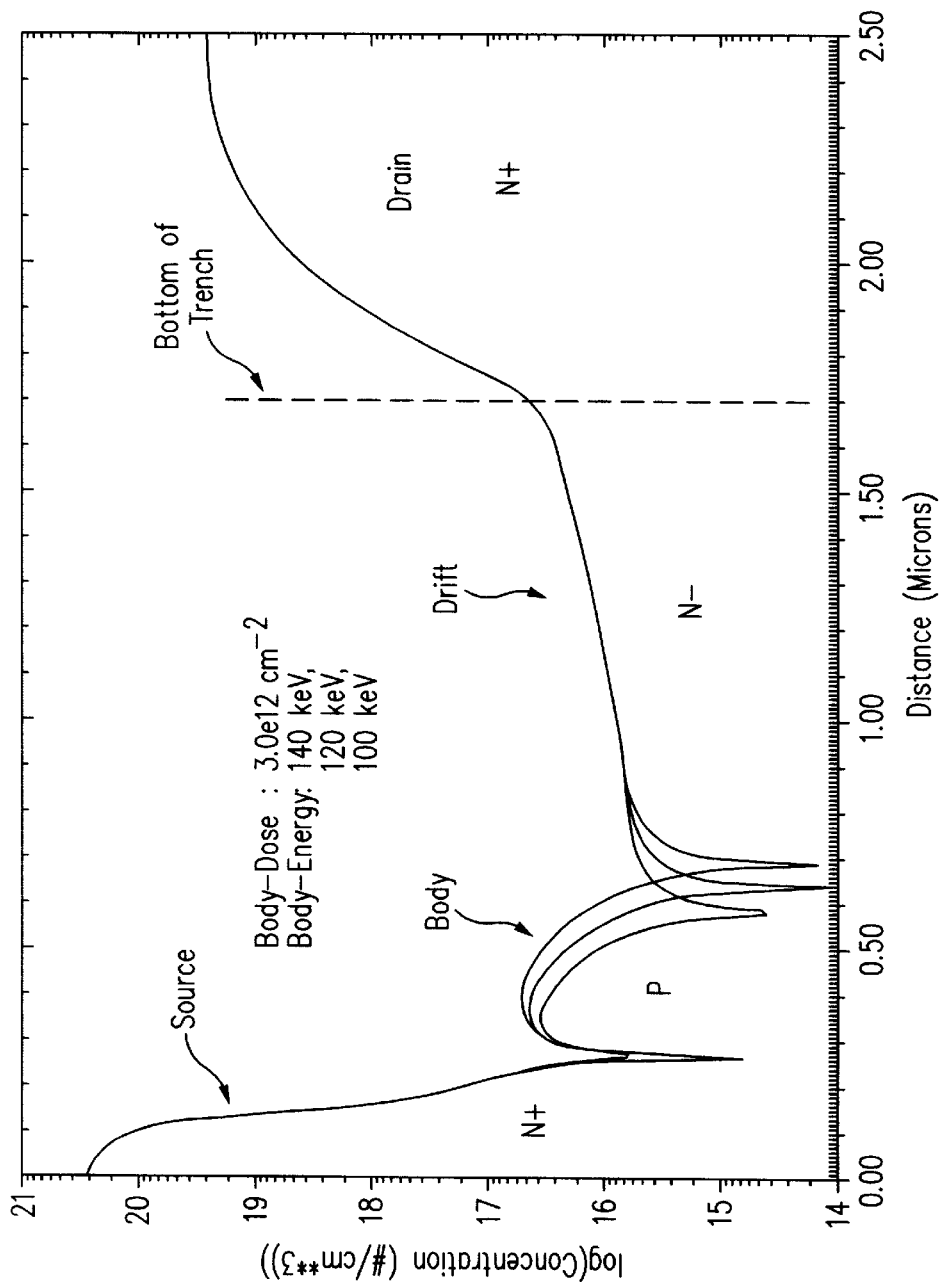
FIG. 8 is a graph showing the doping profile of the Barrier-ACCUFET in a vertical cross-section.

The data provided above refer to a uniform doping profile in the epi-layer (i.e., the epi-layer before the formation of the body and source regions). Numerical simulations have also been performed to study the impact of a graded doping profile in the epi-layer on the performance of the device. The graded doping approach means there is a steady increase on the doping concentration in the epi-layer in the direction towards the heavily doped substrate. Using a linear doping profile in the epi-layer, a flat, uniform electric field distribution can be achieved, as described in S. Merchant, IEEE Trans. on Electron Devices, Vol. 46, June 1999, pp. 1264–1267. However, a Gauss-like doping profile (linear on a logarithmic scale, as shown in FIG. 8) is preferable because it is easier to manufacture. A graded doping profile appears to be advantageous in terms of a reduced on-resistance of the device.

The following parameters were chosen in one embodiment using the graded doping approach:

| | |
|---|---|
| Thickness of epi-layer | 2.5 μm |
| $N_{epi}$ | $7 \times 10^{15}$ cm$^{-3}$ (at the body-drain junction) to $3.5 \times 10^{16}$ cm$^{-3}$ (at the substrate doping gradient) |
| Depth of trench | 1.7 μm |
| TB$_{ox}$ | 0.2 μm |

In this embodiment, even though the trench does not extend to the interface between the epi-layer and the substrate, the trench does extend into the doping gradient between the substrate and the epi-layer, as described above and as shown in FIG. 8, discussed below.

This set of parameters results in a MOSFET having a breakdown voltage of 23 V and an on-resistance which depends on the body dopino concentration and the gate oxide thickness, both of which determine the threshold voltage.

FIG. 8 is a graph of the doping profile in the 20 V Barrier-ACCUFET in a vertical section through the channel region. The P body doping profile is shown for an implant dose of $3.0\times10^{12}$ cm$^{-2}$ at implant energies of 100 keV, 120 keV and 140 keV. The peak body doping concentration is in the range of $5\times10^{16}$ cm$^{-3}$. The body doping profile contains much less charge than in a conventional MOSFET design, and this results in a shorter channel (i.e., on the order of 0.4 μm). As indicated, the N+ substrate (drain) has a doping concentration of about $2\times10^{19}$ cm$^{-3}$ and the N+ source reaches a doping concentration of about $2\times10^{20}$ cm$^{-3}$ at the surface of the silicon. Between the body region and the N+ substrate is the drift region of the epi-layer, wherein the doping concentration increases in a Gauss-like progression from about $7\times10^{15}$ cm$^{-3}$ at the junction with the body to about $4\times10^{16}$ cm$^{-3}$ where the gradient increases as a result of the influence of the N+ substrate (in this embodiment, also the level of the bottom of the trench).

Figure 9B:
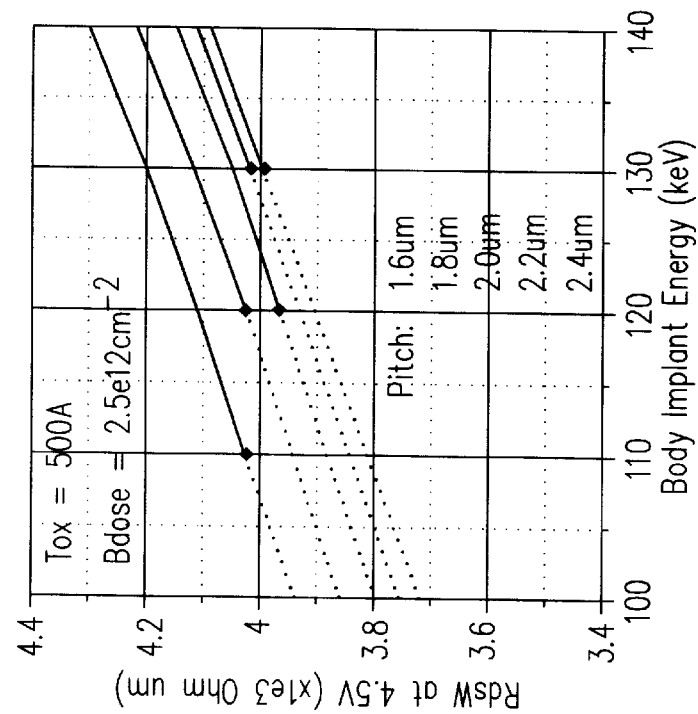
FIG. 9B is a graph of the specific on-resistance of the Barrier-ACCUFET as a function of the energy used to implant the body region.
Figure 9A:
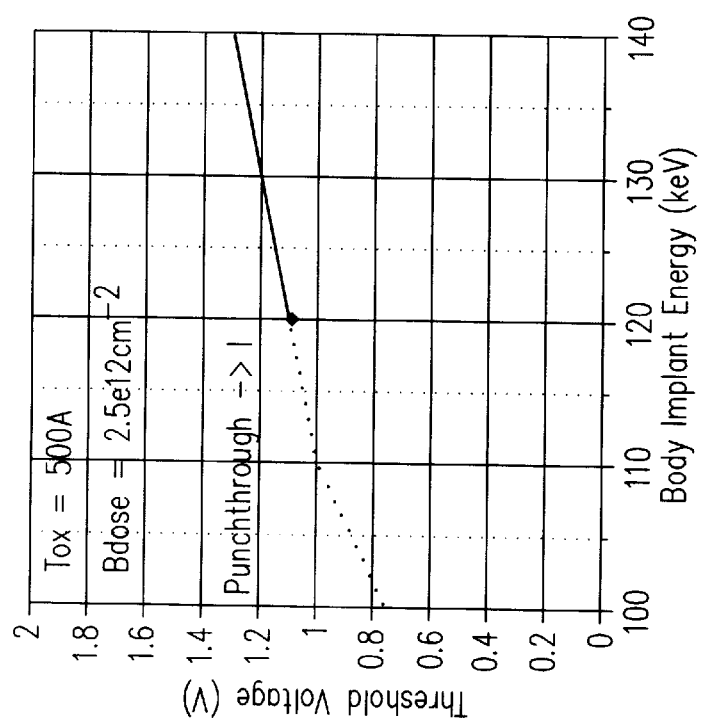
FIG. 9A is a graph of the threshold voltage of the Barrier-ACCUFET as a function of the energy used to implant the body region.

To optimize the device, it is necessary to define the minimum body implant energy that prevents punchthrough. The graphs shown in FIGS. 9A and 9B, both based on MEDICI simulations, assist in this process. FIG. 9A shows the threshold voltage of the device as a function of the body implant energy at a gate oxide thickness of 500 Å and a body implant dose of $2.5\times10^{12}$ cm$^{-2}$. As indicated, the threshold voltage can be less than 1.2 V even with a gate oxide as thick as 500 Å. In order to avoid punchthrough under these conditions, the implant energy has to be at least about 120 keV, as indicated by the transition point between the dotted and solid lines. FIG. 9B shows the specific resistance $R_{ds}W$ per unit channel width (at a gate voltage of 4.5 V) as a function of the body implant energy for a device having the same gate oxide thickness and body implant dose. The trench width was held fixed at 0.8 μm and the pitch was varied from 1.6 μm to 2.4 μm. Thus the mesa width varied from 0.8 μm to 1.6 μm. It is evident that decreasing the pitch from 2.4 μm to 2.0 μm permits the use of shallower body by decreasing the body implant energy from 140 keV to 120 keV without punchthrough. While a further decrease in the pitch to 1.6 μm would allow an even lower implant energy of 100 keV, a very small pitch is difficult to manufacture.

As a result, the preferred parameters are as follows:

| Trench width | 0.8 μm |
|---|---|
| Mesa width | 1.2 μm |
| Body implant dose | 2.5 × 10$^{12}$ cm$^{-2}$ |
| Body implant energy | 120 keV |

Figure 10:
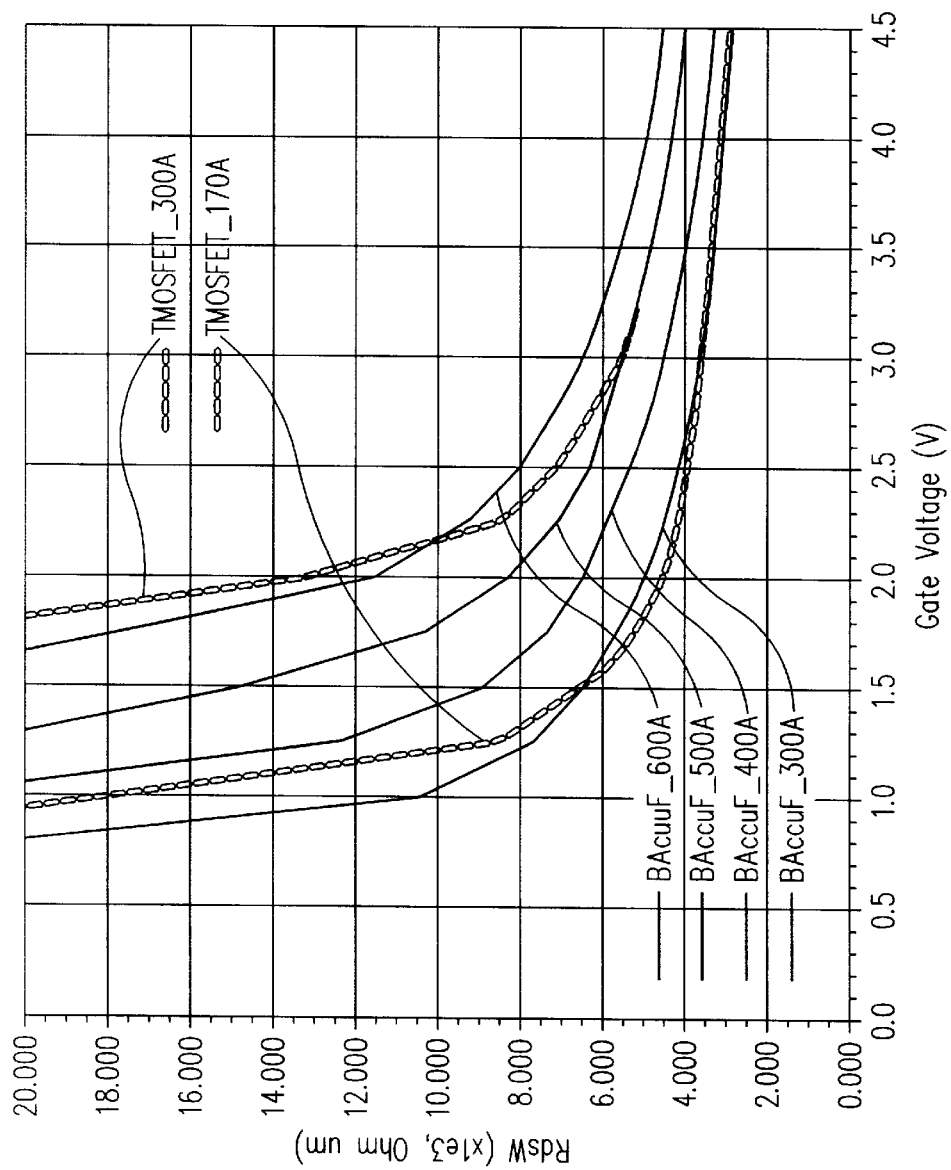
FIG. 10 is a comparative graph of the specific on-resistance of Barrier-ACCUFETs and conventional MOSFETs having different gate oxide thicknesses as a function of the gate voltage.

The last parameter to be defined is the gate oxide thickness. FIG. 10 shows the specific resistance of a Barrier-ACCUFET as compared with the specific resistance of a conventional MOSFET. In both cases, the specific resistance per unit channel width is shown as a function of the gate voltage for specific gate oxide thicknesses. As indicated, about the same resistance can be achieved with almost double the gate oxide thickness.

Thus a 20 V Barrier-ACCUFET according to this invention, with $V_{GS(MAX)}$ equal to ±12 V can have a gate oxide thickness of 300 Å and a threshold voltage of only 0.6 V as shown in FIG. 10. This result cannot be achieved using conventional MOSFET technology. The methodology described above for the design of a 20 V device is presented as an example and can be adapted to design devices having different voltage ratings.

Figure 11:
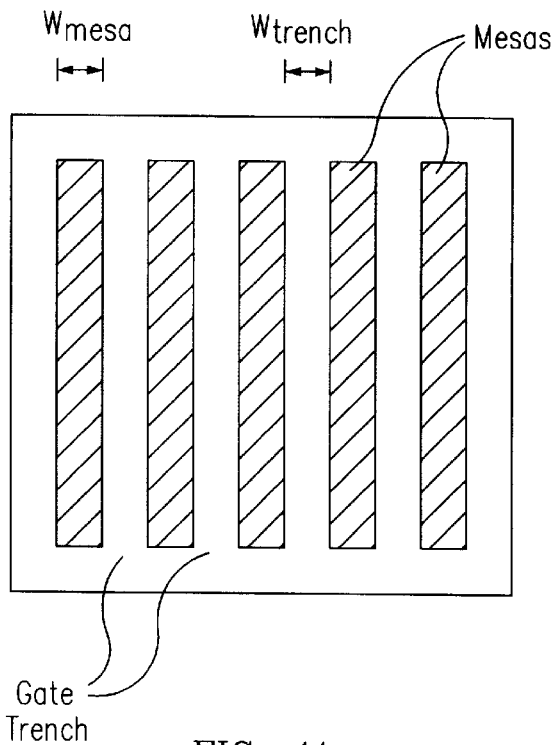
FIG. 11 shows a top view of a Barrier-ACCUFET laid out in a stripe geometry.

In one embodiment the Barrier-ACCUFET cells are laid out in a "stripe" configuration as shown in the top view of FIG. 11. Alternatively, a closed cell configuration including, for example, square or hexagonal cells, can be used.

Figure 12:
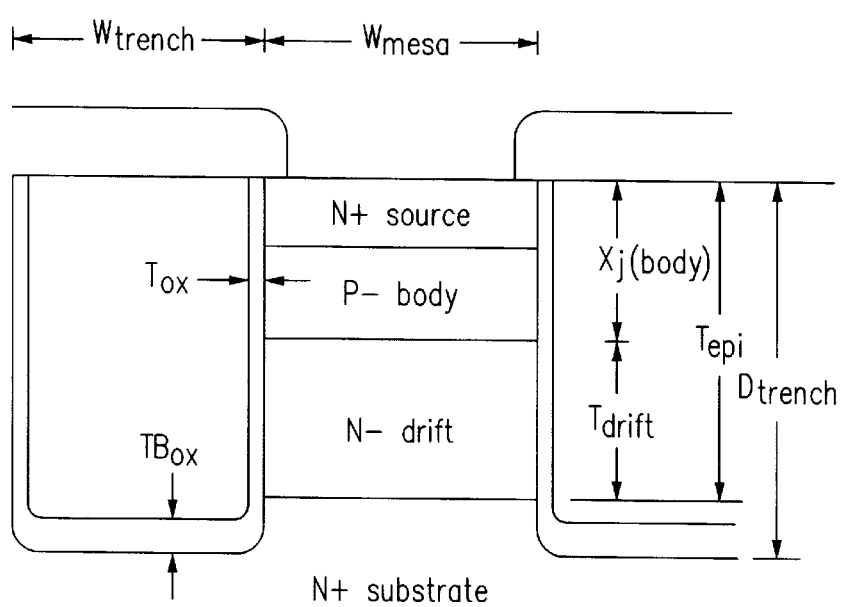
FIG. 12 illustrates various dimensions of a Barrier-ACCUFET.

The following is a more generalized design process for manufacturing a Barrier-ACCUFET in a stripe geometry. Some of the dimensions referred to are illustrated in FIG. 12.

1. Select a gate oxide thickness ($T_{ox}$), typically the minimum thickness that will withstand the maximum gate-source voltage ($V_{GS(MAX)}$) for the device.

2. If the maximum drain-source voltage ($V_{DS(MAX)}$) exceeds $V_{GS(MAX)}$, select a minimum gate oxide thickness for the bottom of the trench ($TB_{ox}$) required to withstand a continuous drain-source voltage equal to $V_{DS(MAX)}$.

3. Select a width for the mesa region between trenches ($W_{mesa}$), preferably the minimum width allowable by the fabrication technology (e.g., etch and lithography limits) in order to fabricate contacts with the source and body regions of the Barrier-ACCUFET.

4. Select a width for the trench ($W_{trench}$), typically the minimum that the trench formation technology (e.g., reactive ion etch) allows, but preferably greater than two times the thickness of the bottom oxide ($TB_{ox}$).

5. The remaining parameters to be selected are (i) the doping concentration (either constant or graded) and thickness of the drift region ($T_{drift}$), (ii) the doping profile of the body region, and (iii) the depth of the trench ($D_{trench}$). These interacting parameters are to be optimized under technology and device constraints. This is accomplished by the following iterative procedure:

(i) Select a thickness and doping level, either uniform or graded, for the epi-layer such that the drift region of the epi-layer between the trenches is fully depleted when the device is in an off condition. This requirement can be assured if the charge density in the drift region is less than or equal to 5×10$^{12}$ cm$^{-2}$. For example, having selected the width of the mesa to fulfill the technological constraints, the maximum doping level for the mesa is:

$$N_{epi} \leq \frac{5 \times 10^{12} \text{ cm}^{-2}}{W_{mesa}}$$

where $N_{epi}$ is the doping concentration of the epi-layer (cm$^{-3}$) and $W_{mesa}$ is the width of the mesa (cm). The thickness of the epi-layer can be estimated according to the following formula.

$$T_{epi} \geq \frac{V_{DS(MAX)}}{20 \text{ V/μm}} + X_j(body)$$

where $T_{epi}$ is the thickness of the epi-layer, $V_{DS(MAX)}$ is the maximum drain-source voltage, and $X_j(body)$ is the estimated depth of the body-drain junction.

(ii) Select a trench depth ($D_{trench}$) that exceeds the thickness of the epi-layer, i.e., the trench extends into the substrate.

(iii) Select the minimum charge density of the body that is necessary to prevent punchthrough. If the body is to be formed by implant, this entails selecting a dose and energy for the body implant necessary to prevent punchthrough; if the body is to be formed epitaxially, this entails selecting the dose and thickness of the P-type epitaxial layer for the formation of the body necessary to prevent punchthrough.

(iv) With a starting estimate of a desirable doping profile for the body region, the doping level of the epi-layer may be increased and the thickness of the epi-layer decreased until punchthrough is reached or the breakdown voltage falls below the required $V_{DS(MAX)}$. The body implant dose will typically need to be adjusted to compensate for the dopant in the channel region of the Barrier-ACCUFET.

6. If the design is successful at the initial value chosen for the thickness of the gate oxide, the process can be repeated for thicker gate oxide layers if the application requires a lower gate capacitance.

7. If the process technology imposes a trench depth less than the thickness of the epi-layer, the above design may be used as a starting point. The depth of the trench may then be decreased accompanied by a decrease in the doping level of the epi-layer to achieve a viable design.

Computer-aided design tools allow the simultaneous optimization of the body, epi-layer and trench parameters and may be utilized once the interactions between these parameters are understood as described above and in the example.

Figure 13:
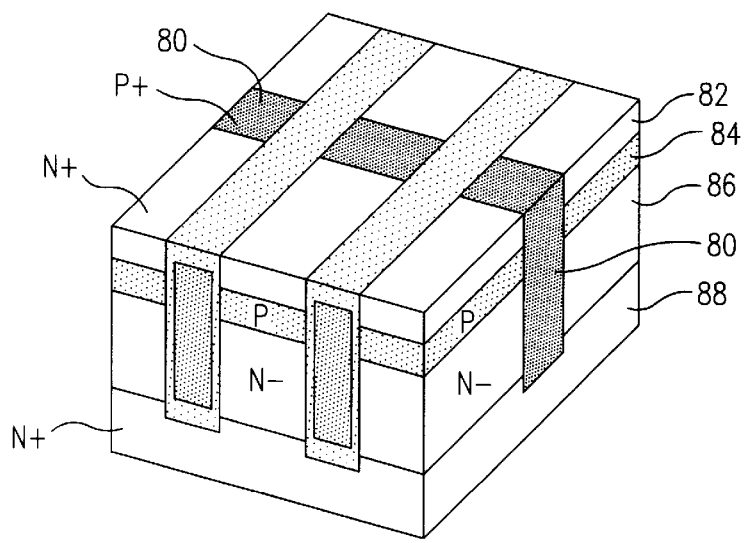
FIG. 13 shows a Barrier-ACCUFET laid out in a modified stripe geometry which includes a clamping diode to limit the maximum drain-source voltage.

In a modified "stripe" configuration, shown in FIG. 13, P+ regions 80 extend through the N+ source regions 82, the P-body regions 84 and the N− drift regions 86 to form a junction with the N+ substrate 88. The PN junction between P+ regions 80 and the N+ substrate 88 constitutes a clamping diode which limits $V_{DS(MAX)}$ and thereby prevents damage to the device. The separation between the P+ regions 80 can be less than 2.5 μm. An added benefit is that the two-dimensional pinching effect in the N− drift regions 86 is converted into a three-dimensional effect, since depletion regions in the N− drift regions 86 extend from the gate trenches and PN junctions with the P-body regions 84 and the P+ regions 80.

FIGS. 14A–14D illustrate a process of forming one embodiment of a Barrier-ACCUFET according to this invention. The process begins with the growth of an N-epitaxial layer on an N+ silicon substrate and an initial oxidation of the top surface of the epitaxial layer. If clamping diodes are to be included in the device, a first mask layer is formed to define the location of the deep diffusions that will form the clamping diodes, and dopant is implanted through openings in the first mask at a high energy. In one embodiment, the P+ clamping diodes are implemented as stripes perpendicular to the trenches and diffused to reach the N+ substrate, as shown in FIG. 13.

A second mask layer is then formed over the initial oxidation layer with an opening which defines the active area of the device, and the initial oxidation layer is removed through an opening in the second mask layer. The second mask layer is removed, and a third mask layer is formed to define the locations of the trenches. The trenches are formed by a reactive ion etch (RIE) through openings in the third mask layer. As is customary, a sacrificial oxide layer is formed in the walls and bottom of the trench and then etched to remove the silicon that was damaged by the RIE etch.

The gate oxide layer is then formed thermally on the walls and bottom of the trench. Preferably, the gate oxide layer is made thicker at the bottom of the trench. In one embodiment this is done by implanting ions vertically after the sacrificial oxide layer has been removed to damage the crystal structure of the silicon at the bottom of the trench. The ions implanted into the bottom of the trench should convert the crystalline material to an amorphous layer. To this end, the dose of the implanted ions should exceed a critical value known in the art as the threshold dose (see S. Wolf and R. N. Tauber, *Silicon Processing For The VLSI Era*, Vol. 1, page 302). In one embodiment, argon ions are implanted with an energy of 100 keV and a dose higher than $4 \times 10^{14}$ ions/cm$^2$. In another embodiment silicon ions are implanted at 100 keV with a dose higher than $5 \times 10^{14}$ ions/cm$^2$. Because the ions are implanted vertically, they do not enter the sidewalls of the trench. This leads to a higher rate of oxidation at the bottom of the trench during the subsequent thermal process that forms the gate oxide.

Figure 14A:
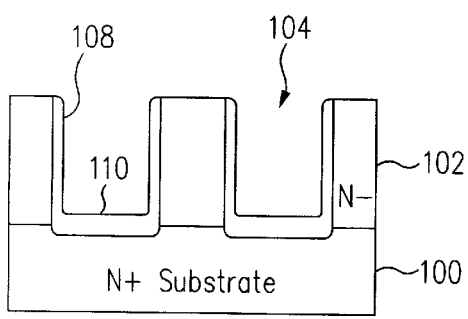
FIGS. 14A–14D show the steps of a process used to fabricated a Barrier-ACCUFET of this invention.

The result is the structure shown in cross-section in FIG. 14A. An N-epitaxial layer 102 overlies an N+ silicon substrate 100. Trenches 104 are formed in the epitaxial layer 102 and extend into the N+ substrate 100. A gate oxide layer 108 lines the walls of the trenches 104 and includes a thicker portion 110 at the bottoms of the trenches 104. For example, trenches 104 are 0.8 μm wide and the mesas are 1.2 μm wide to yield a pitch of 2.0 μm. Trenches 104 can be 1.7 μm deep and the N+ substrate 100 and N-epitaxial layer 102 can have doping concentrations as shown in FIG. 8.

Figure 14B:
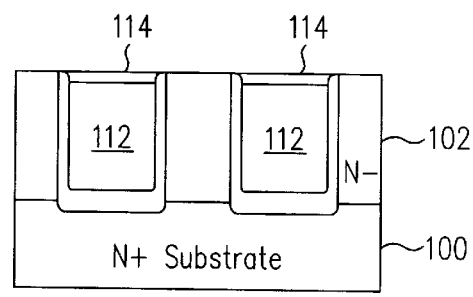
Figure 14C:
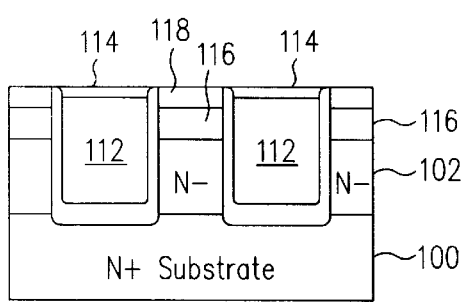
Figure 14D:
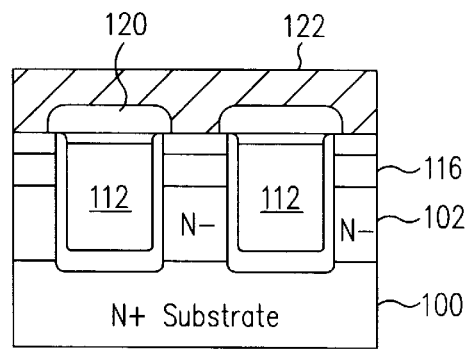

A polysilicon layer 112 is then deposited, filling trenches 104, and doped with N-type dopant to a concentration equal to or greater than $2 \times 10^{19}$ cm$^{-3}$ Polysilicon layer 112 can be doped with phosphorus by POCl$_3$ predisposition and driven-in at 970° C. for 40 minutes, for example. A fourth mask layer is formed and polysilicon layer 112 is then etched back to a level coplanar with or slightly below the top surfaces of the mesas. The fourth mask layer is patterned such that gate runners are left connecting the trenches 104. An oxide layer 114 is then formed over the polysilicon layer 112 by a dry thermal oxidation at 1050° C. for 10 minutes. The resulting structure is shown in FIG. 14B.

P-type dopant (boron) is implanted to form a body region 116 (e.g., $2.5 \times 10^{12}$ cm$^{-2}$ at 120 keV). N-type dopant is implanted at a dose of $5 \times 10^{15}$ cm$^{-2}$ and an energy of 60 keV to form N+ source regions 118. Optionally, for this step a fifth mask layer can be formed to block the areas where contact is to be made to the body region 116 at the silicon surface. This leaves the structure shown in FIG. 14C.

A layer 120 of borophosphosilicate glass (BSPG) is deposited on the top surface of the structure and reflowed. A sixth mask layer is formed over the BSPG layer 120 to define the openings where contact is to be made to the source regions 118 and the body regions 116. The BSPG layer 120 is then etched through the openings in the sixth mask layer, exposing the silicon in these areas. P-type dopant can be implanted at a dose of $1 \times 10^{15}$ cm$^{-2}$ and an energy of 50 keV to form body contact regions at the surface of the silicon. The P-type dopant is not concentrated enough to affect the doping of the N+ source regions 118. The BSPG layer 120 is reflowed and a metal layer 122 is deposited, masked and etched, yielding the structure shown in FIG. 14D.

Figure 15:
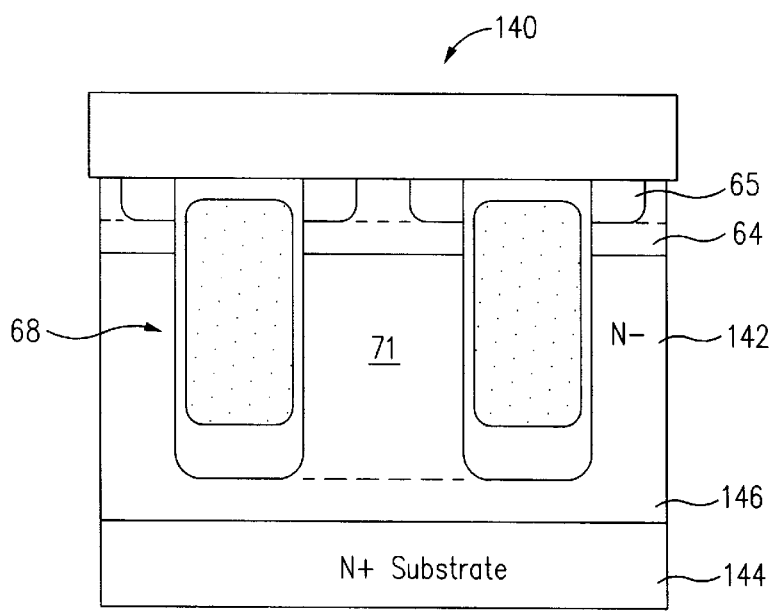
FIG. 15 shows a Barrier-ACCUFET in which the trench does not extend entirely through the epitaxial layer or into the dopant gradient created by the heavily doped substrate.

While specific embodiments of the invention have been described, those skilled in the art will understand that the principles of this invention extend to numerous additional embodiments. For example, while in the description above the trench extends at least as far as the doping oradient resulting from the updiffusion of the substrate, in other embodiments this is not the case. FIG. 15 shows an embodiment which is similar to MOSFET 60 shown in FIGS. 6A–6C, except that in MOSFET 140 the trench 68 does not extend all the way through the N– drift region 142 such that a portion of drift region 142 is interposed between the bottom of trench 68 and N+ substrate 144. In this embodiment the drift region 142 that is located in the mesa 71 (denoted by the dashed line) is depleted when MOSFET 140 is turned off. As in the other embodiments, dopant from the heavily doped N+ substrate 144 diffuses upward into the epi-layer 146 to form a dopant gradient within epi-layer 146.

We claim:

1. A barrier accumulation-mode field-effect transistor comprising:

a semiconductor chip having first and second principal surfaces;

a trench extending from the first principal surface of the semiconductor chip, the trench having first and second sections which define a mesa;

a gate disposed in the trench and insulated by a dielectric layer from the semiconductor chip, the gate being doped with ions of a first conductivity type;

a source region of the first conductivity type located in the mesa adjacent the first principal surface of the semiconductor chip;

a body region of a second conductivity type located in the mesa beneath the source region and adjacent the trench, the body region forming a source-body junction with the source region; and a drain region of the first conductivity type located beneath the body region, the drain region forming a drain-body junction with the body region, wherein the net charge density of ions of the second conductivity type in the body region is no greater than $1.5 \times 10^{12}$ cm$^{-2}$, measured with reference to a plane parallel to the top surface of the semiconductor chip and calculated as an integral of the net doping concentration in the body region between the source-body junction and the drain-body junction.

2. A barrier accumulation-mode field-effect transistor comprising:

a semiconductor chip having first and second principal surfaces, the semiconductor chip comprising a substrate and an epitaxial layer overlying the substrate;

a trench extending from the first principal surface of the semiconductor chip, the trench having first and second sections which define a mesa;

a gate disposed in the trench and insulated by a dielectric layer from the semiconductor chip, the gate being doped with ions of a first conductivity type;

a source region of the first conductivity type located in the mesa adjacent the first principal surface of the semiconductor chip;

a body region of a second conductivity type located in the mesa beneath the source region and adjacent the trench; and a drain region of the first conductivity type located beneath the body region, the drain region comprising a drift region of the first conductivity type, at least a portion of the drift region being located in the mesa, wherein the drift region in the mesa is depleted when the MOSFET is turned off.

3. The Barrier-ACCUFET of claim 2 wherein the Barrier-ACCUFET is turned off when a voltage applied to the gate is equal to a voltage applied to the source.

4. The Barrier-ACCUFET of claim 2 comprising a doping gradient in the epitaxial layer, the doping gradient resulting from updiffusion of dopant from the substrate.

5. The Barrier ACCUFET of claim 4 wherein the trench extends at least to the doping gradient.

6. The Barrier ACCUFET of claim 5 wherein the trench extends into the substrate.

7. The Barrier ACCUFET of claim 4 wherein a portion of the drift region is interposed between a bottom of the trench and the substrate.

8. The Barrier ACCUFET of claim 2 wherein the doping concentration in the drift region gradually increases from the junction between the drift region and the body region to a location where the doping concentration begins to increase as a result of updiffusion of dopant from the substrate.

9. The Barrier-ACCUFET of claim 2 wherein the epitaxial layer is about 2.5 $\mu$m thick, the trench is about 1.7 $\mu$m deep, and the doping concentration of the drift region is about $7 \times 10^{15}$ cm$^{-3}$ at the junction between the drift region and the body region and about $3.5 \times 10^{16}$ cm$^{-3}$ at a level where the doping concentration begins to increase as a result of updiffusion of dopant from the substrate.

10. The Barrier-ACCUFET of claim 2 wherein a thickness of the dielectric layer at a bottom of the trench is about 0.2 $\mu$m.

11. A barrier accumulation-mode field-effect transistor comprising:

a semiconductor chip having first and second principal surfaces, the semiconductor chip comprising a substrate and an epitaxial layer overlying the substrate;

a trench extending from the first principal surface of the semiconductor chip, the trench having first and second sections which define a mesa;

a gate disposed in the trench and insulated by a dielectric layer from the semiconductor chip, the gate being doped with ions of a first conductivity type;

a source region of the first conductivity type located in the mesa adjacent the first principal surface of the semiconductor chip;

a body region of a second conductivity type located in the mesa beneath the source region and adjacent the trench; and a drain region of the first conductivity type located beneath the body region, the drain region comprising a drift region of the first conductivity type, at least a portion of the drift region being located in the epitaxial layer, wherein the net charge density of ions of the first conductivity type in a portion of the drift region between the trenches is no greater than $5 \times 10^{12}$ cm$^{-2}$, measured with reference to a plane perpendicular to the top surface of the semiconductor chip and calculated as an integral of the net doping concentration across the mesa from the first section to the second section of the trench to trench.

12. The Barrier-ACCUFET of claim 11 wherein the Barrier-ACCUFET is turned off when a voltage applied to the gate is equal to a voltage applied to the source.

13. The Barrier-ACCUFET of claim 11 comprising a doping gradient in the epitaxial layer, the doping gradient resulting from updiffusion of dopant from the substrate.

14. The Barrier ACCUFET of claim 13 wherein the trench extends at least to the doping gradient.

15. The Barrier ACCUFET of claim 14 wherein the trench extends into the substrate.

16. The Barrier ACCUFET of claim 13 wherein a portion of the drift region is interposed between a bottom of the trench and the substrate.

17. The Barrier ACCUFET of claim 11 wherein the doping concentration in the drift region gradually increases from the junction between the drift region and the body region to a location where the doping concentration begins to increase as a result of updiffusion of dopant from the substrate.

18. The Barrier-ACCUFET of claim 11 wherein the epitaxial layer is about 2.5 $\mu$m thick, the trench is about 1.7 $\mu$m deep, and the doping concentration of the drift region is about $7 \times 10^{15}$ cm$^{-3}$ at the junction between the drift region and the body region and about $3.5 \times 10^{16}$ cm$^{-3}$ at a level where the doping concentration begins to increase as a result of updiffusion of dopant from the substrate.

19. The Barrier-ACCUFET of claim 11 wherein a thickness of the dielectric layer at a bottom of the trench is about 0.2 $\mu$m.

* * * * *